United States Patent
Brass et al.

(10) Patent No.: US 6,370,069 B2
(45) Date of Patent: Apr. 9, 2002

(54) METHOD FOR TESTING A MULTIPLICITY OF WORD LINES OF A SEMICONDUCTOR MEMORY CONFIGURATION

(75) Inventors: Eckhard Brass, Unterhaching; Thilo Schaffroth, Röhrmoos; Joachim Schnabel; Helmut Schneider, both of München, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/867,254

(22) Filed: May 29, 2001

(30) Foreign Application Priority Data

May 26, 2000 (DE) .......................... 100 26 275

(51) Int. Cl.⁷ .............................................. G11C 29/00
(52) U.S. Cl. .................... 365/201; 365/230.06
(58) Field of Search ...................... 365/201, 230.06, 365/149, 189.11

(56) References Cited

U.S. PATENT DOCUMENTS

| | | | | | |
|---|---|---|---|---|---|
| 4,751,679 | A | * | 6/1988 | Dehganpour | 365/201 |
| 5,317,532 | A | * | 5/1994 | Ochii | 365/149 |
| 5,617,369 | A | * | 4/1997 | Tomishima et al. | 365/230.06 |
| 5,905,685 | A | | 5/1999 | Nakamura et al. | 365/207 |
| 6,016,281 | A | * | 1/2000 | Brox | 365/230.06 |
| 6,049,495 | A | * | 4/2000 | Hsu et al. | 365/203 |
| 6,064,601 | A | | 5/2000 | Yoo et al. | 365/189.04 |

* cited by examiner

*Primary Examiner*—Son Mai
(74) *Attorney, Agent, or Firm*—Herbert L. Lerner; Laurence A. Greenberg; Werner H. Stemer

(57) ABSTRACT

A method for testing a multiplicity of word lines of a semiconductor memory configuration in a multiple word line wafer test is described. To prevent a pulling-up of inactive word lines which are at a negative voltage when the active word lines are ramped down, the inactive word lines are decoupled from the negative word line voltage and are connected to a high impedance shortly before the active word lines are ramped down.

6 Claims, 1 Drawing Sheet

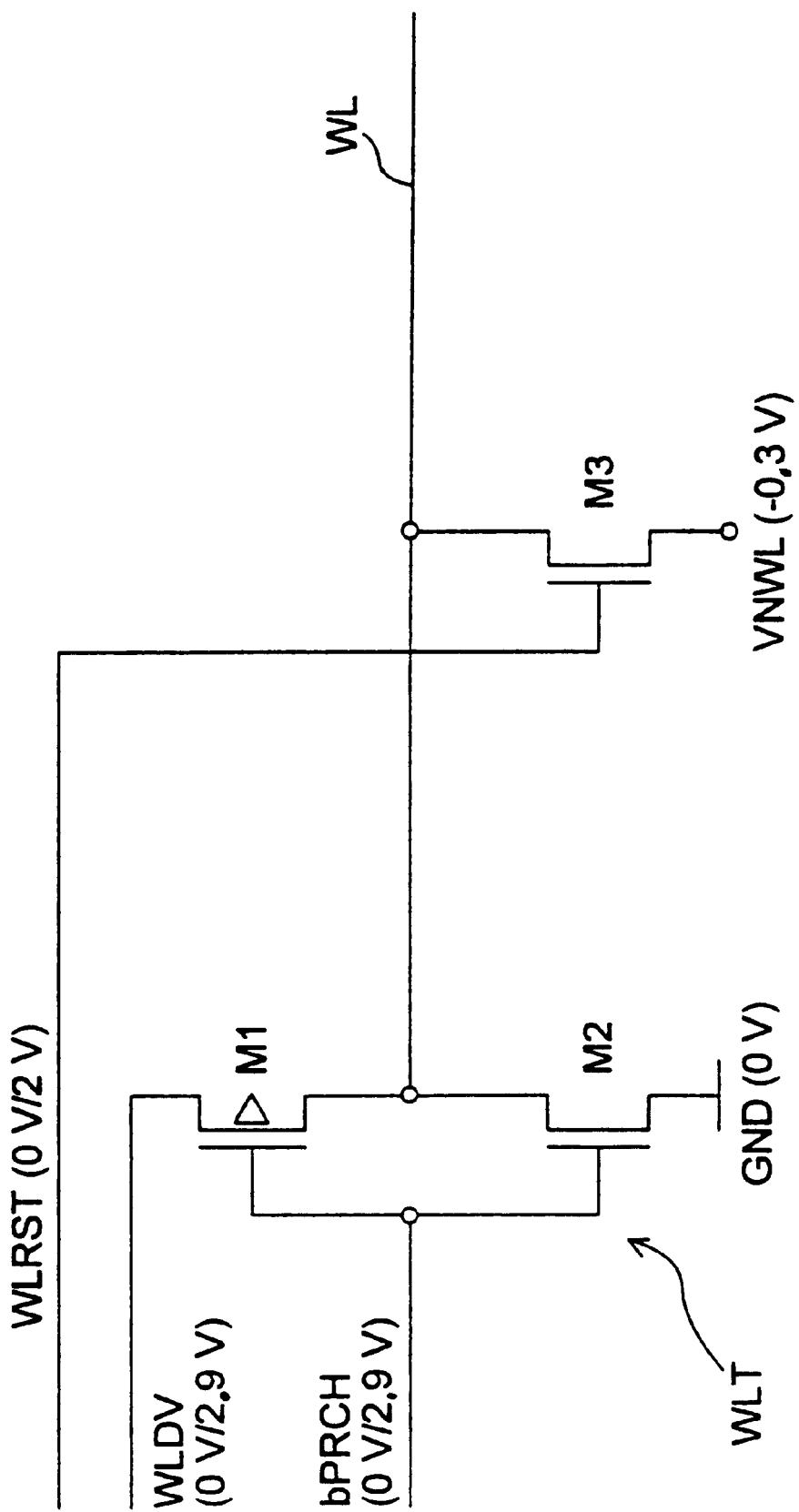

METHOD FOR TESTING A MULTIPLICITY OF WORD LINES OF A SEMICONDUCTOR MEMORY CONFIGURATION

BACKGROUND OF THE INVENTION

FIELD OF THE INVENTION

The present invention relates to a method for testing a multiplicity of word lines of a semiconductor memory configuration in a multiple word line (WL) wafer test in which a number of word lines are initially ramped up to a high potential and are thus enabled, and in which the active word lines thus ramped up are then ramped down to a negative potential.

In more recent generations of semiconductor memory configurations such as, for example, in the 0.14 μm SDRAM generation, inactive word lines, that is to say word lines which are not activated for writing or reading a memory cell, are not placed at ground potential, that is to say 0 V, as previously but up to a slightly negative word line voltage of about −0.3 V. The negative word line voltage is provided by a separate generator for this purpose in the semi-conductor memory configuration.

Compared with the ground potential of 0 V, ramping down the inactive word lines to a slightly negative voltage has a significant advantage. The negative word line voltage reduces the blocking voltage of the selection transistors of the individual memory cells which allows these transistors to hold data for longer. In other words, the negative word line voltage leads to an improvement in the data retention time.

If semiconductor memory configurations are configured in such a manner that the inactive word lines are at a slightly negative word line voltage in order to improve the data retention time, this leads to problems in the "multiple WL wafer test", in which a number of the word lines are first ramped up to a high potential and are thus enabled, and in which then the active word lines thus ramped up are then brought down to a low potential. In the multiple word line wafer test, considerably more word lines are thus ramped up than in the normal operation of the semiconductor memory configuration.

If then, after the ramping-up of a multiplicity of the word lines into the active state, these are ramped down again, these word lines, due to the very high capacitance of the many active word lines, will pull up the potential of the voltage during ramping-down so that it can assume 0 V or higher values. As a result, the retention time of the inactive memory cells which are not connected to ramped-up word lines is inevitably impaired considerably so that it is possible for memory cell contents to be lost.

The problem indicated above does not appear in semiconductor memory configurations in which the inactive word lines are at ground potential which is attributable to the fact that the power system which provides the ground potential is buffered by a much lower impedance and a much greater capacitance than the power system supplying the negative word line potential.

To overcome the problem indicated above it has previously been thought of to ramp down the active word lines to the negative word line potential not at once but slowly in two stages in the multiple word line wafer test, namely to ground potential in a first step and then to the negative word line potential in a second step and it is true that, as a result, pulling-up of the negative word line potential of the inactive word lines can be largely prevented.

However, such a two-stage ramping-down of the active word lines in the multiple word line wafer test is expensive and requires considerably more time than ramping down in only one stage.

SUMMARY OF THE INVENTION

It is accordingly an object of the invention to provide a method for testing a multiplicity of word lines of a semiconductor memory configuration that overcomes the above-mentioned disadvantages of the prior art devices of this general type, which allows the wafer test to be performed rapidly and without great expenditure.

With the foregoing and other objects in view there is provided, in accordance with the invention, a method for testing a multiplicity of word lines of a semiconductor memory configuration in a multiple word line wafer test. The method includes the steps of: inducing a high potential on some of the word lines resulting in active word lines; floating remaining ones of the word lines not induced by the high potential at a negative word line potential with a high impedance, the remaining ones of the word lines defining inactive word lines; ramping down the active word lines to a low potential; and subsequently reconnecting all of the word lines to the negative word line potential.

According to the invention, the object is achieved in a method of the type initially mentioned, in that the word lines not ramped up and thus inactive are floating at the negative word line potential with a high impedance before the active word lines are ramped down, and in that, after the active word lines have been ramped down, all the word lines are reconnected to the negative word line potential.

In the method according to the invention, the inactive word lines are thus not connected to the negative word line potential shortly before the active word lines are ramped down in the multiple word line wafer test. Instead, the inactive word lines are floated on the negative word line potential at a high impedance. It is only when active word lines have been ramped down that all the word lines are also connected to the negative word line potential.

Such a procedure is extremely advantageous since the word lines ramped down can only pull down the inactive word lines further due to the capacitive coupling between the word lines.

The method according to the invention can be implemented in a simple manner without great changes in the existing semiconductor memory configurations. It is only necessary to adapt the logic of word line drives supplying the negative word line potential appropriately to the above procedure or to make the generator providing the negative word line potential stronger, but this requires additional chip area.

It is thus of considerable importance in the method according to the invention that the inactive word lines are disconnected from the negative voltage and connected to a high impedance shortly before the active word lines are ramped down in the multiple word line wafer test.

Other features which are considered as characteristic for the invention are set forth in the appended claims.

Although the invention is illustrated and described herein as embodied in a method for testing a multiplicity of word lines of a semiconductor memory configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The single FIGURE of the drawing is a circuit diagram of a word line drive according to the invention.

DESCRIPTION OF THE PREFERRED EMBODIMENT

Referring now to the single FIGURE of the drawing in detail, there is shown an illustrative embodiment of a diagrammatic circuit of a word line drive for the 0.14 µm SDRAM generation.

A word line WL is connected to a word line drive WLT formed of complementary field effect transistors M1, M2 which are connected in series between a ground potential GND and a word line drive voltage WLDV of 0 V or 2.9 V, respectively, and are driven via a precharging voltage bPRCH of also 0 V and 2.9 V respectively. A field effect transistor M3 is connected between the word line WL and a negative potential VNWL of −0.3 V and can be driven via a word line reset signal WLRST of 0 V and 2 V respectively.

In the multiple word line wafer test, the word line WL is ramped up to 2.9 V via the word line drive WLT, the transistor M3 being switch off, and is then ramped down again to 0 V.

If the word line WL shown is an inactive word line and other word lines, not shown, of the memory cell array are activated, the inactive word line WL is initially at the negative word line potential of −0.3 V with the field effect transistor M3 switched on. Shortly before the active word lines are ramped down, the inactive word line WL is floated at the negative word line potential at a high impedance. For this purpose, a corresponding WLRST signal is applied to the transistor M3 to switch it off. When the word line drive WLT is also switched off, the inactive word line WL then floats at the negative word line potential of −0.3 V with a high impedance.

Once all the word lines WL of the memory cell array of the semiconductor memory configuration have been ramped down, all the word lines WL are reconnected to the negative word line potential VNWL, for which purpose a corresponding WLRST signal is applied to the transistor M3.

We claim:

1. A method for testing a multiplicity of word lines of a semiconductor memory configuration in a multiple word line wafer test, which comprises the steps of:

inducing a high potential on some of the word lines resulting in active word lines;

floating remaining ones of the word lines not induced by the high potential at a negative word line potential with a high impedance, the remaining ones of the word lines defining inactive word lines;

ramping down the active word lines to a low potential; and subsequently reconnecting all of the word lines to the negative word line potential.

2. The method according to claim 1, which comprises connecting the inactive word lines to the negative word line potential before the active word lines are ramped down.

3. The method according to claim 1, which comprises setting the negative word line potential to approximately −0.3 V.

4. The method according to claim 1, which comprises applying the negative word line potential to the word lines through a transistor.

5. The method according to claim 1, which comprises setting the high potential to be a voltage level of approximately 2.9 volts.

6. The method according to claim 1, which comprises setting the low potential to be approximately 0 volts.

* * * * *